United States Patent
Kang et al.

(10) Patent No.: US 6,498,927 B2
(45) Date of Patent: Dec. 24, 2002

(54) AUTOMATIC GAIN CONTROL METHOD FOR HIGHLY INTEGRATED COMMUNICATION RECEIVER

(75) Inventors: Suwon Kang, Seoul (KR); Jeong-Woo Lee, Seoul (KR); Joonbae Park, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/940,637

(22) Filed: Aug. 29, 2001

(65) Prior Publication Data

US 2002/0142745 A1 Oct. 3, 2002

Related U.S. Application Data

(60) Provisional application No. 60/279,126, filed on Mar. 28, 2001.

(51) Int. Cl.$^7$ .............................. H04B 7/00; H03G 9/00
(52) U.S. Cl. ................... 455/245.2; 455/247.1; 455/251.1; 455/253.2; 455/234.2; 455/324; 330/133; 330/278
(58) Field of Search .................... 455/245.2, 247.1, 455/251.1, 253.2, 245.1, 246.1, 234.2, 235.1, 250.1, 232.1, 234.1, 239.1, 240.1, 241.1, 312, 324, 303, 307, 308; 330/129, 279, 278, 133, 134, 130

(56) References Cited

U.S. PATENT DOCUMENTS

| | | | | |
|---|---|---|---|---|
| 5,095,533 A | * | 3/1992 | Loper et al. | 455/324 |
| 5,095,536 A | * | 3/1992 | Loper | 455/324 |
| 5,179,730 A | * | 1/1993 | Loper | 455/324 |
| 5,483,691 A | * | 1/1996 | Heck et al. | 455/245.2 |
| 5,963,855 A | * | 10/1999 | Lussenhop et al. | 455/245.1 |
| 6,307,902 B1 | * | 10/2001 | Walley | 455/234.1 |
| 6,373,907 B1 | * | 4/2002 | Katsura et al. | 455/245.2 |
| 2001/0022821 A1 | * | 9/2001 | Ichihara | 375/317 |
| 2002/0047744 A1 | * | 4/2002 | Ichihara | 330/133 |

* cited by examiner

Primary Examiner—William Trost
Assistant Examiner—Rafael Perez-Gutierrez
(74) Attorney, Agent, or Firm—Fleshner & Kim, LLP

(57) ABSTRACT

A wireless or wired communication system and method is provided including a transmitter and a receiver. A RF communication system in accordance with the present invention includes an apparatus and gain control method between RF receiver and baseband modem in case of a plurality of gain stages inside a receiver. The gain of each stage can be controlled by an integrated gain controller. The gain controller monitors the signal level of each gain stage to place its gain to optimal value. The gain control apparatus and method can be implemented in a digital AGC system. The gain controller accepts a signal implementing gain control and thus there is no stability issue. When distributed gain stages are present inside a related art receiver and separate gain control loops are used, stability issues can arise. In a preferred embodiment of an apparatus and method, the baseband modem decides the amount of gain control and adjusts the gain of certain gain stages by the proper amount.

18 Claims, 16 Drawing Sheets

AUTOMATIC GAIN CONTROL METHOD FOR HIGHLY INTEGRATED COMMUNICATION RECEIVER

This application claims priority to U.S. Provisional Application Ser. No. 60/279,126, filed Mar. 28, 2001, whose entire disclosure is incorporated herein by reference.

BACKGROUND OF THE INVENTION

1. Field of the Invention

This invention generally relates to a circuit and method for gain control, and in particular to a circuit and method for gain control in wireless or wired communication systems.

2. Background of the Related Art

FIG. 1 illustrates a wireless receiver conceptually divided into two major sections being an analog front-end and a base-band digital signal processor (DSP). As shown in FIG. 1, in a receiver 100 an analog front-end 106 receives a modulated signal through an antenna 102, amplifies the modulated signal and down-converts the modulated signal directly to a low frequency 108 or through a suitable intermediate frequency (IF). The low frequency analog signal 108 is converted to digital bits by an analog-to-digital converter and goes to the base-band DSP section 110 for demodulation and further digital processing. An output 112 of the DSP section 110 is received by a user.

The analog front-end generally needs good sensitivity to detect the desired signal despite a weak signal strength and a linearity. Among different types of architectures used in radio frequency integrated circuits (RF ICs), the direct conversion architecture, also known as homo-dyne, has advantages for low-power applications.

FIG. 2 shows a block diagram of a related art direct conversion receiver 200. The direct conversion receiver 200 is important because it can accomplish channel selection filtering by processing within a chip, which helps to reduce the number of off-chip components, and thereby achieve better miniaturization. As shown in FIG. 2, the related art direct conversion receiver 200 is a highly integrated receiver that includes an antenna 202 that is connected to a low noise amplifier (LNA) 210 through a duplex filter 206. The LNA 210 has an output 212 that is respectively fed into a first mixer 216 and a second mixer 218. A serial programming interface 220 receives an input 223 from outside the direct conversion receiver 200, and also receives an output 229 from a crystal oscillator 227. The serial programming interface 220 outputs a channel setting 224 to a frequency synthesizer 228. A clock generator 222 also receives an input 225 from the crystal oscillator 227 and outputs a reference clock 226 to the frequency synthesizer 228. The frequency synthesizer 228 is made up of a PFD 232, a loop filter 230, a prescaler 234, and a voltage-controlled oscillator (VCO) 236. An output 240 of the frequency synthesizer 228 is received by a phase shifter 244. The phase shifter 244 has a +45° output 246 fed into the mixer 216 and a −45° output 248 fed into the second mixer 218.

In the related art direct conversion system 200, a desired RF signal passing the duplex filter 206 and amplified by the LNA 210 is directly down converted by the mixer 216 because a local oscillator (LO) frequency 246, which is the phase shifted signal 240 from the frequency synthesizer 228, is equal to a carrier frequency of the desired RF signal. The down converted signal 250 is amplified by the variable gain amplifier (VGA) 252 before the base band (BB) filter 256 to get the amplitude large enough to overcome the large noise floor of the BB low pass filter 256 before the analog-to-digital converter (ADC) 260, which outputs one channel 280 (e.g., in-phase channel I) of the direct conversion receiver 200. A mixer 218, a VGA 266, a BB filter 270 and an ADC 274 operate to output a second channel 276 (e.g., quadrature-phase channel Q) of the direct conversion receiver 200.

The simplicity of the direct conversion architecture offers two important advantages over superheterodyne architecture. First, the problem of generation of images is circumvented because an intermediate frequency (IF) in the superheterodyne receiver is baseband (i.e., $F_{IF}=0$) in the direct conversion receiver. As a result, no image filter is required and the LNAs do not have to drive a 50-ohm load. Second, the IF SAW filter and subsequent down-conversion stages can be replaced with low-pass filters and baseband amplifiers, both of which can be easily implemented in a single chip.

However, the related art direct conversion receivers have disadvantages for high performance radio receivers. First, rejection of out-of-channel interferers with an active low-pass filter is more difficult than with a passive filter because active filters exhibit much more severe noise-linearity-power trade-offs than do their passive filter counterparts. However, several related art topological candidates for baseband circuits will now be described.

As shown in FIG. 3, an input 302 for a related art baseband circuit 300a is then transmitted to a low-pass BB filter 304 that suppresses out-of-channel interferers, thereby allowing a series connected amplifier 308 to be a nonlinear, high-gain VGA amplifier. The low-pass filter 304 further allows an ADC 312 to have a moderate dynamic range. However, the low-pass filter 304 preceding the amplifying stages imposes tight noise-linearity trade-offs in the baseband circuit 300a. An output 314 of the ADC 312 is the output of the baseband structure.

As shown in FIG. 3, a second related art baseband circuit 300b relaxes the LPF noise requirements while demanding a higher performance in the amplifier. In the baseband circuit 300b, an input 316 is initially fed into a VGA 318, and an amplified signal 320 of the VGA 318 is received by a low-pass BB filter 322. An output 324 of the BB filter 322 is received by an ADC 326. The ADC 326 has an output 328 that is the output of the second baseband structure.

As shown in FIG. 3, a third related art baseband circuit 300c demonstrates the use of channel filtering in the digital domain. In the baseband circuit 300c, an input 330 is fed into a VGA 332, and an output 334 of the VGA 332 is received by an ADC 336. A BB filter 340 receives an output 338 of the ADC 336. An output 342 of the BB filter 340 is the output of the third baseband circuit 300c. In the third baseband circuit 300c, the ADC 336 must achieve both a high degree of linearity so as to digitize the signal with minimal intermodulation of interferers, as well as exhibit a thermal and quantization noise floor well below the signal level.

As described above, trade-offs required by the individual baseband structures shown in FIG. 3 are alleviated by combining the above methods, so that amplification and filtering are distributed to several gain and filter stages, which optimizes the performance. In modern communication systems, the required channel filtering must exceed 60 dB in order to reject interferers in nearby channels. Also, the required signal gain must exceed 70 dB. The implementation of baseband circuits without external passive elements are quite difficult, regardless of any configuration shown in FIG. 3, because the front-end stage has too severe dynamic range requirements. However, the dynamic range requirements of individual elements of a baseband circuit can be relaxed by employing several gain and filtering stages in series.

FIG. 4 is a block diagram that shows a related art direct conversion receiver. As shown in FIG. 4, a direct conversion receiver 400 includes a baseband circuit 420 with a plurality of amplifiers and filters. However, the specific configuration of the baseband circuit 420 can be modified depending on system requirements.

As shown in FIG. 4, an RF signal is received by an antenna 402 and filtered by a duplex filter 406, and a filtered signal 408 is amplified by a LNA 410. The filtered amplified signal 412 is down converted to a baseband signal by a local oscillator (LO) signal 416 in a mixer 414. Within the baseband circuit 420, an output 418 from the mixer is variously amplified and filtered before being output to an ADC 442. As shown in FIG. 4, the baseband circuit 420 uses a first VGA 422, a first BB filter 426, a second VGA 430, a second BB filter 434, and a third VGA 438 connected in series between the mixer 414 and the ADC 442, which produces an output 444 of the front end of the direct conversion receiver 400.

The related art communication 400 receiver implements a dedicated gain-control scheme in the baseband circuit 420 to give best performance during demodulation. Especially for a CDMA system, automatic gain control loops have critical importance in determining system performance. However, the complex baseband circuit shown in FIG. 4 has various disadvantages. When the distributed filtering scheme is incorporated as shown in FIG. 4, the gain control becomes difficult because the total gain should also be distributed between several gain stages while currently considering interference levels.

FIGS. 5A and 5B are diagrams that illustrate variable system performance of the complex baseband circuit 420 within the direct conversion receiver 400. Every gain and filtering stage in the direct conversion receiver has limits to its maximum and minimum signal level, namely every gain and filtering stage has a limited dynamic range. The signal level in any stage should lie within the dynamic range of that stage.

FIG. 5A shows signal propagation diagram 503 for the case where the signal level lies within the bound. As shown in FIG. 5A, in the signal propagation diagram 503, the system 400 has a maximum limit 510. A desired signal 546, which is less than an interferer output 548, when received and measured at the output of the antenna 402. At the output 412 of the LNA 410, the desired signal level 550 increases, however, the interferer level 552 also increases and remains larger than the signal level 550. The desired signal level 554 is increased at the output of the first VGA 422, but the interferer level 556 is increased and remains larger than the desired signal level 554. At the output of the second VGA 430, the signal level 558 is larger than the interferer level 560. At the output 440 of the third VGA 438, the signal level 562 is at is at a required output level 515 for input to the ADC 442 while the interferer level 564 is significantly reduced compared to the desired signal level 562.

On the other hand, FIG. 5B shows signal propagation diagram 505 for a case where the gain distribution is not proper. As shown in FIG. 5B, in the Problem) signal propagation diagram 505, the system 400 has a maximum limit of signal level 520. A desired signal level 572 is less than an interferer signal level 574 when received and measured at the output of the antenna 402. At the output 412 of the LNA 410, the signal level 576 increases, however, the interferer level 578 also increases and remains larger than the desired signal level 576. The desired signal level 580 is increased at the output of the first VGA 422, but the interferer level 582 is increased and remains larger than the signal level 580. Further, the interferer level 582 is above the maximum limit of signal level 520 causing a linearity problem 530. At the output of the second VGA 430, the signal level 584 is larger than the interferer level 586. At the output 440 of the third VGA 438, the signal level 588 is at a required signal level 525 for input to the ADC 442, while the interferer level 592 is significantly reduced compared to the signal level 588. The total gain in both cases as shown in FIGS. 5A and 5B is the same, but the system 400 performance will be severely degraded for the situation shown in FIG. 5B.

FIG. 6 is a block diagram that shows a related art superheterodyne receiver. As shown in FIG. 6, a superheterodyne receiver 600 includes an antenna 602, which has an output 604 fed into a duplex filter 606, and an output 608 of the duplex filter 606 is received by the LNA 610. An output 612 of the LNA 610 is received by an image rejection filter 614 and an output 616 of the image rejection filter 614 is received with an LO signal 620 by the mixer 618. An output 622 of the mixer 618 is received by a SAW filter 624. An output 626 of the SAW filter 624 is fed into a second VGA 628 whose output 630 is received by an integrated BB filter 632. An output 634 of the integrated BB filter 632 is received by an ADC 636.

The related art superheterodyne receiver 600 with AGC functionality uses the IF SAW filter 624 to reduce the interferers to negligible levels compared to desired signal levels. Moreover, an external SAW filter has no limit on its dynamic range, and therefore it can filter out large interferences without intermodulation. This is the primary reason communication receivers use such a configuration. In the related art superheterodyne receiver 600, gain control is quite simple as shown in FIG. 7.

FIG. 7 is a diagram that illustrates gain by stages of the superheterodyne receiver 600. As shown in the signal propagation diagram 705, the superheterodyne receiver 600 has a maximum limit of signal level 710. In the case illustrated in FIG. 7, an interference level 742 is greater than a desired signal level 740 when outputted by the antenna 602. After the LNA 610, the desired signal level 744 has increased, but remains less than the interferer level 746. After the mixer 618, the desired signal level 748 has increased and the interferer level 750 has also increased and remains larger than the desired signal level 748. At the output 626 of the SAW filter 624, the desired signal level 752 is stronger than the interferer level 754. After the VGA 628, the desired signal level 756 is increased while the interferer level 758 remains at the same level as the interference level 754. Prior to input to the ADC 636, the desired signal level 760 is at a required signal level 715 while the interferer level 762 is reduced compared to the signal level 760.

In the related art superheterodyne receiver, when the desired signal level is small enough to lie within the ADC's full dynamic range, the baseband modem sends a new signal indicating an increase in gain. When the desired signal level is large, the baseband modem reduces the gain so as not to overload the ADC.

As described above, the related art receivers have various disadvantages. When the distributed gain is incorporated in the related art receivers, gain control should be distributed between several gain stages and distributed while considering interface levels. However, in the related art receivers each gain stage corrects its gain by itself, the total gain loop can become unstable because multiple feedback loops arise during gain control.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a receiver and method of operating same that substantially obviates at least one of the disadvantages of the related art.

Another object of the present invention is to provide automatic gain control in a wired or wireless receiver in which channel selection filtering and gain assignment is distributed to several gain and filtering stages.

Another object of the present invention is to provide a gain control circuit that monitors internal signal levels of the receiver and reflects those monitored levels in the gain control.

Another object of the present invention is to provide a receiver with separate gain stages and method of operating same in which a baseband modem generates the actual gain control.

Another object of the present invention is to provide a radio frequency receiver with separate gain stages and a gain control circuit adjusts the gain by gain stages in order to reduce stability problems and linearity problems.

Another object of the present invention is to provide a radio receiver and method of operating that provides gain control by receiving detection readings from each of the gain stages and modifying distributed gain amounts to control total gain within the receiver to provide a stable and robust gain control method to achieve increased linearity and increased performance relative to noise.

Another object of the present invention is to provide a radio receiver and method of operating that reduces gain control problems for highly integrated radio receivers by providing sufficient prior information about the signal level of each internal stage to a baseband modem or the receiver itself.

Another object of the present invention is to provide a radio receiver and method of operating that provides automatic gain control that controls all gain stages from a low noise amplifier to amplifiers after the analog-to-digital conversion.

Another object of the present invention is to provide an automatic gain control device for a highly integrated radio receiver that controls all gain control stages from an initial amplifier to post amplifiers after the analog-to-digital converter to increase system performance without degrading linearity and stability.

Another object of the present invention is to provide a reliable high speed, low noise, single chip CMOS RF communication system and method for using same.

Another object of the present invention is to provide a CMOS RF receiver on a single chip using multiple gain control stages in the receiver and baseband structure that are centrally controlled to meet desired gain for a selected RF channel.

To achieve at least the above objects and advantages in whole or in part, and in accordance with the purpose of the present invention, as embodied and broadly described, there is provided a direct conversion communication system that includes a first gain stage that amplifies selected signals among received signals having a carrier frequency, a demodulation-mixer that mixes the received amplified carrier frequency selected signals and outputs baseband selected signals, a baseband amplification circuit that includes a plurality of gain stages that receive the baseband selected signals and selectively amplify in-channel signals to a prescribed amplitude, and a gain controller coupled to receive outputs of the gain stages and to control each of the gain stages, wherein the gain controller controls distributed gain among the gain stages to achieve a prescribed total gain.

To further achieve at least the above objects and advantages in whole or in part, and in accordance with the purpose of the present invention, as embodied and broadly described, there is provided a method of operating a communication system that includes receiving signals including selected signals having a carrier frequency, first amplifying the received selected signals, detecting a first output level of the first amplified selected signals, mixing the first amplified selected signals to output demodulated selected signals having a frequency reduced from the carrier frequency, second amplifying the demodulated selected signals until the selected signals reach a prescribed criteria, wherein the second amplifying includes sequentially amplifying the selected signals, detecting a second output level of the second amplified selected signals, digitizing the second amplified selected signals, determining an amplification amount of the digitized selected signals and generating a gain control signal responsive thereto, and controlling a gain distributed among the first and second amplifying according to the gain control signal and the first and second output levels.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
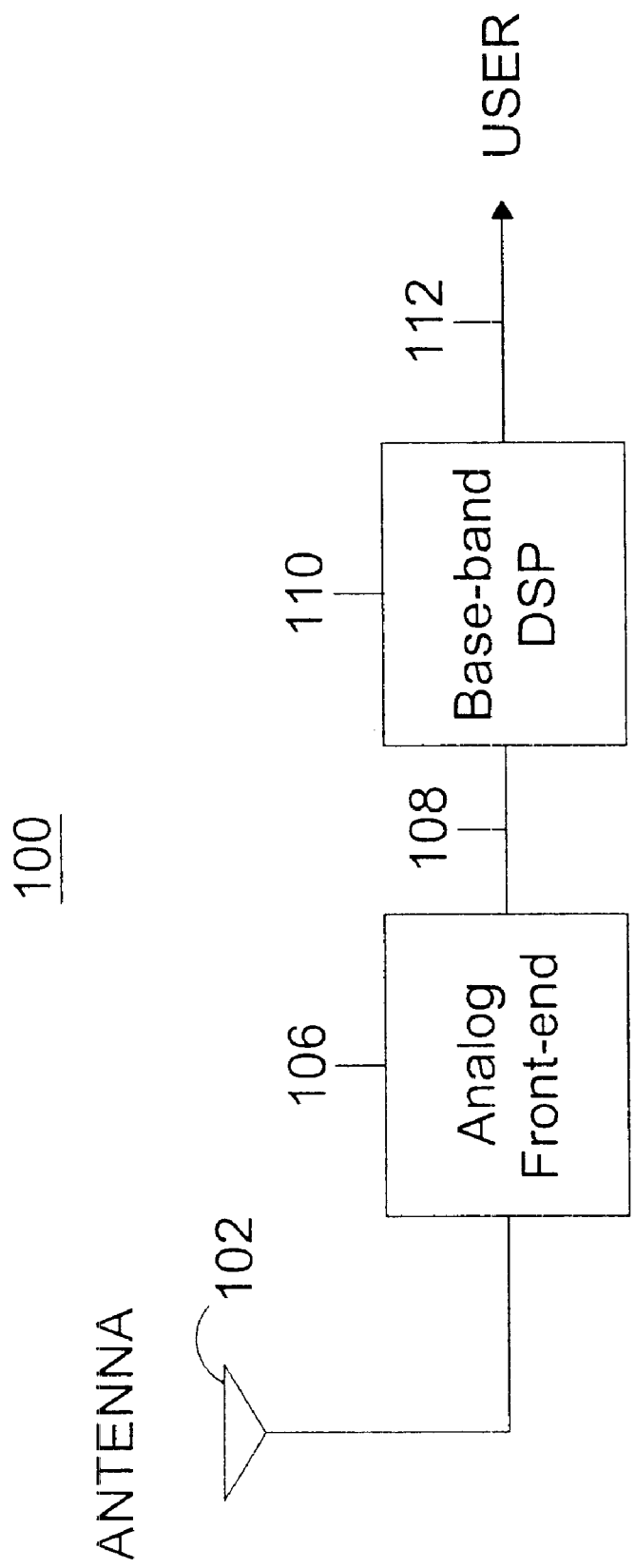
FIG. 1 is a diagram that shows a block diagram of a related art wireless receiver.
Figure 2:
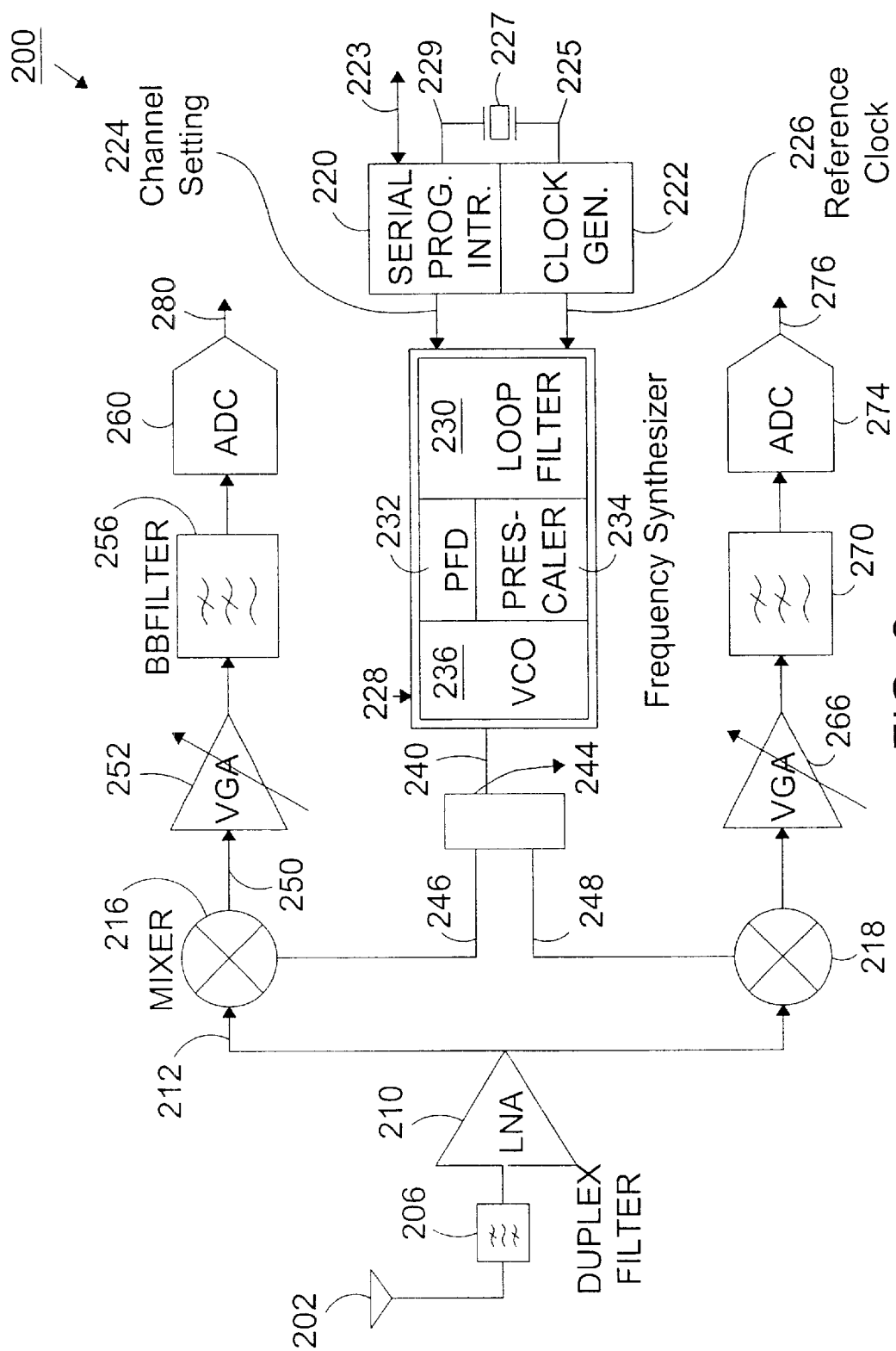
FIG. 2 is a diagram that shows a related art direct conversion radio receiver.
Figure 3:
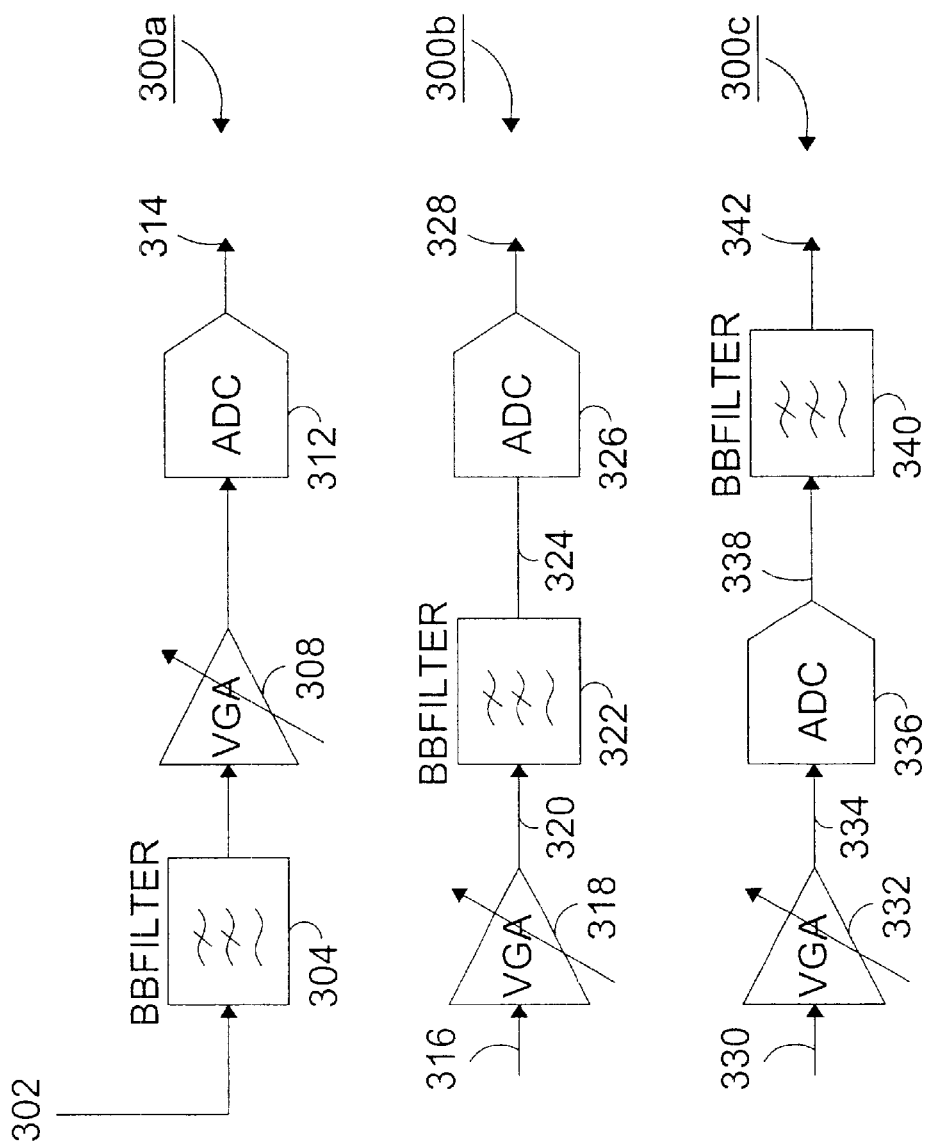
FIG. 3 is a block diagram of exemplary baseband structures for a direct conversion receiver.
Figure 4:
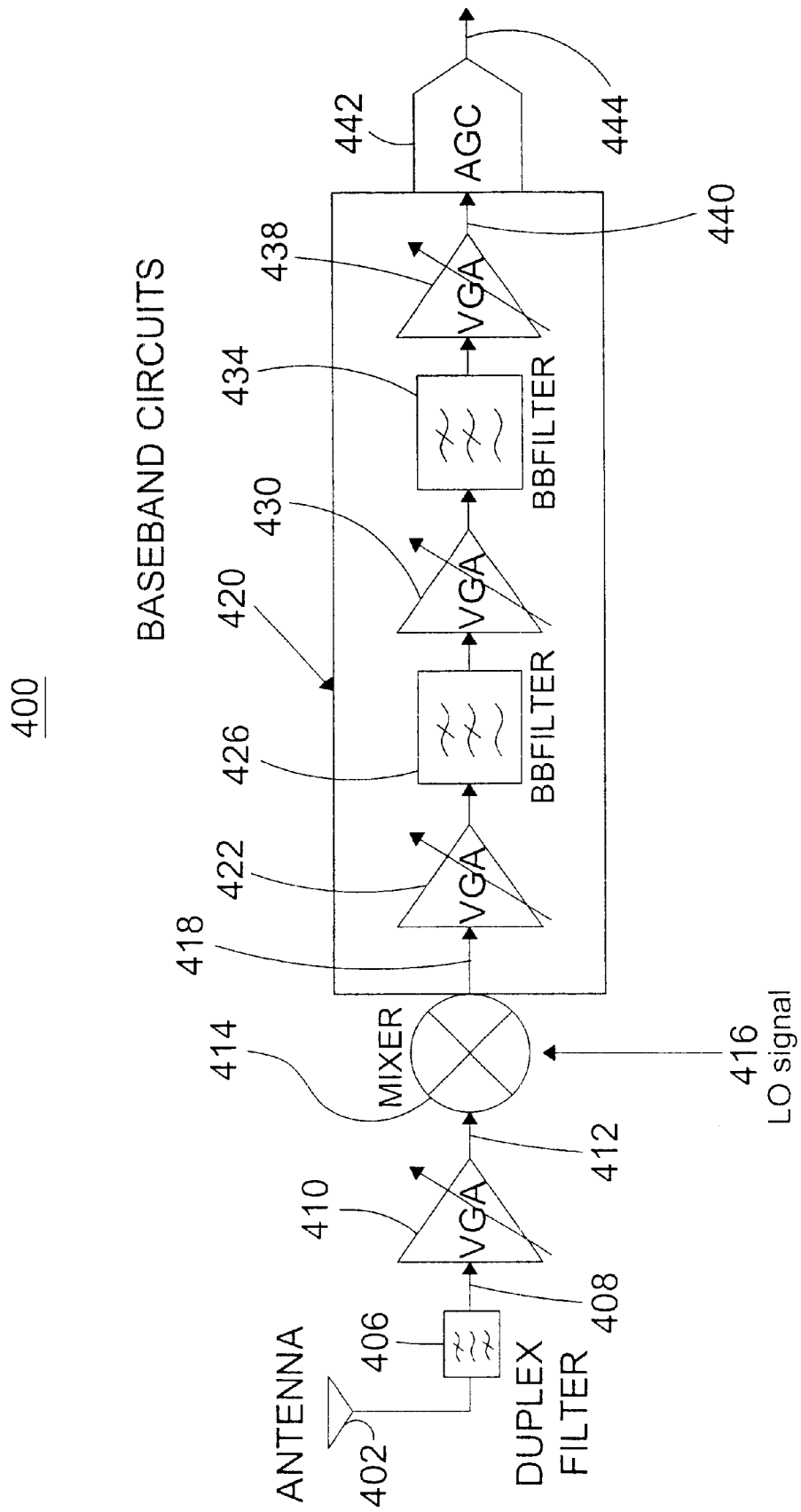
FIG. 4 is a block diagram that shows a related art direct conversion receiver with multiple gain stages in a baseband structure.
Figure 5A:
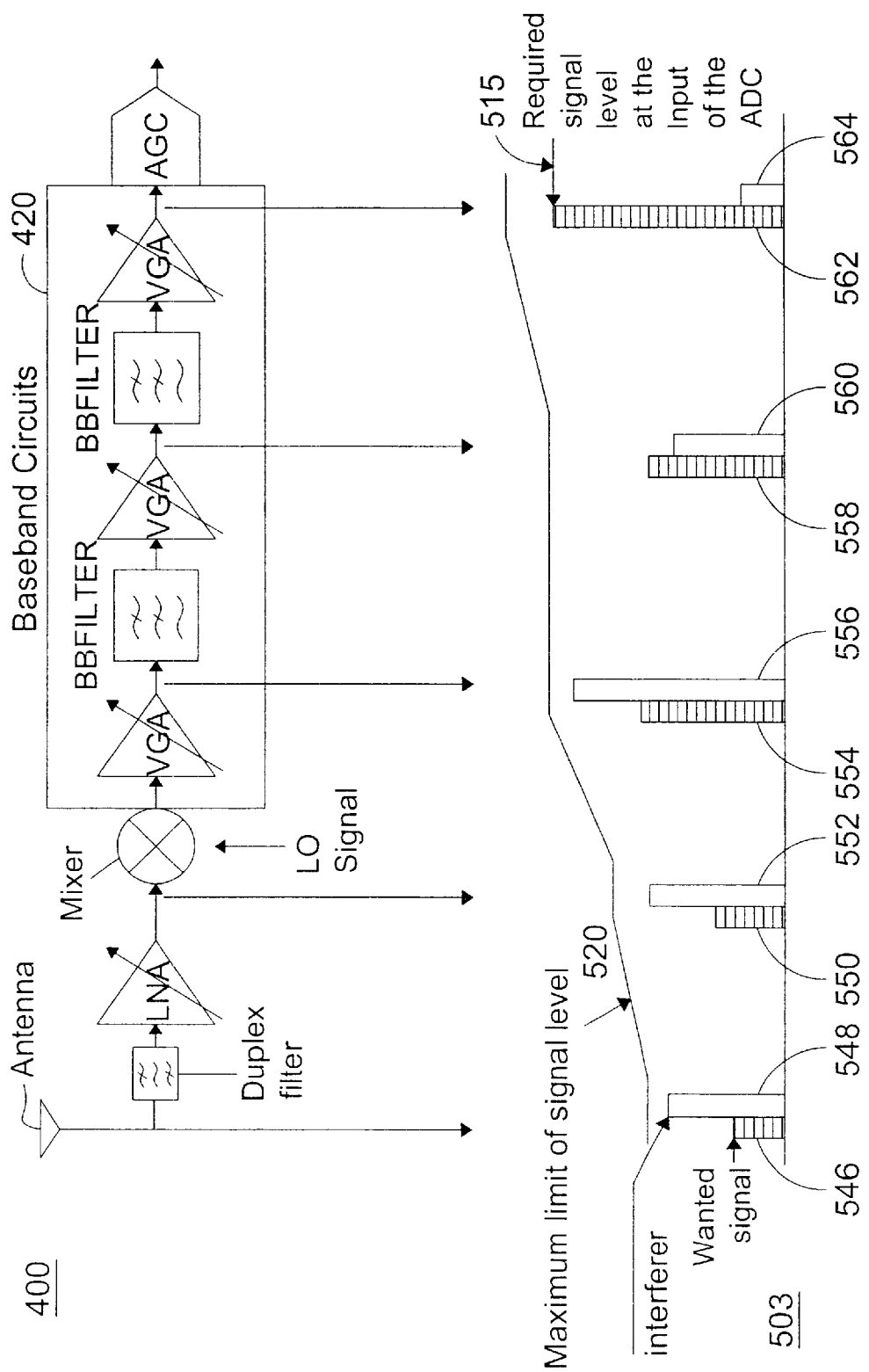
FIGS. 5A–5B are diagrams that show signal propagation in the system of FIG. 4.
Figure 5B:
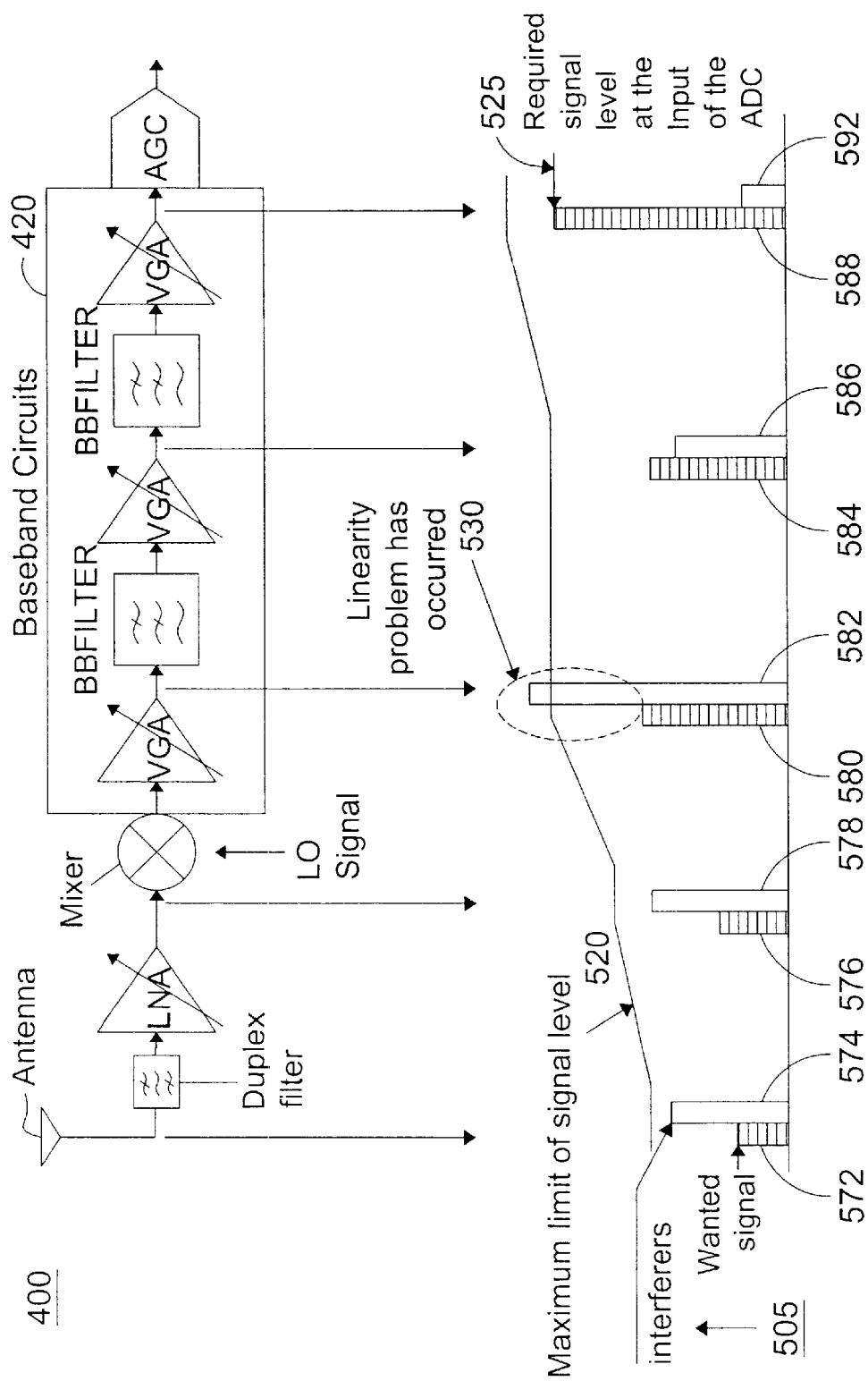
Figure 6:
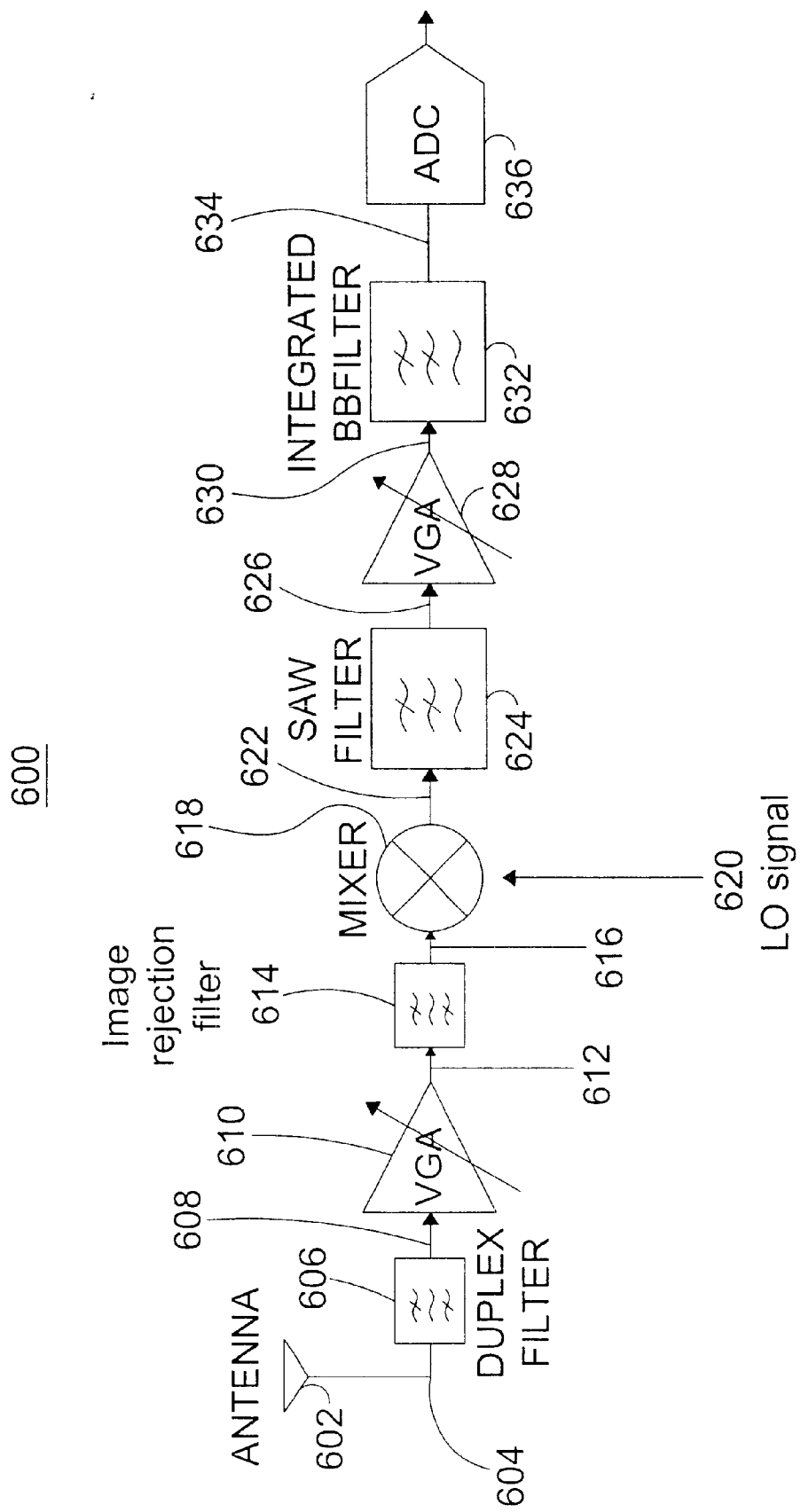
FIG. 6 is a block diagram that shows a related art superheterodyne receiver.
Figure 7:
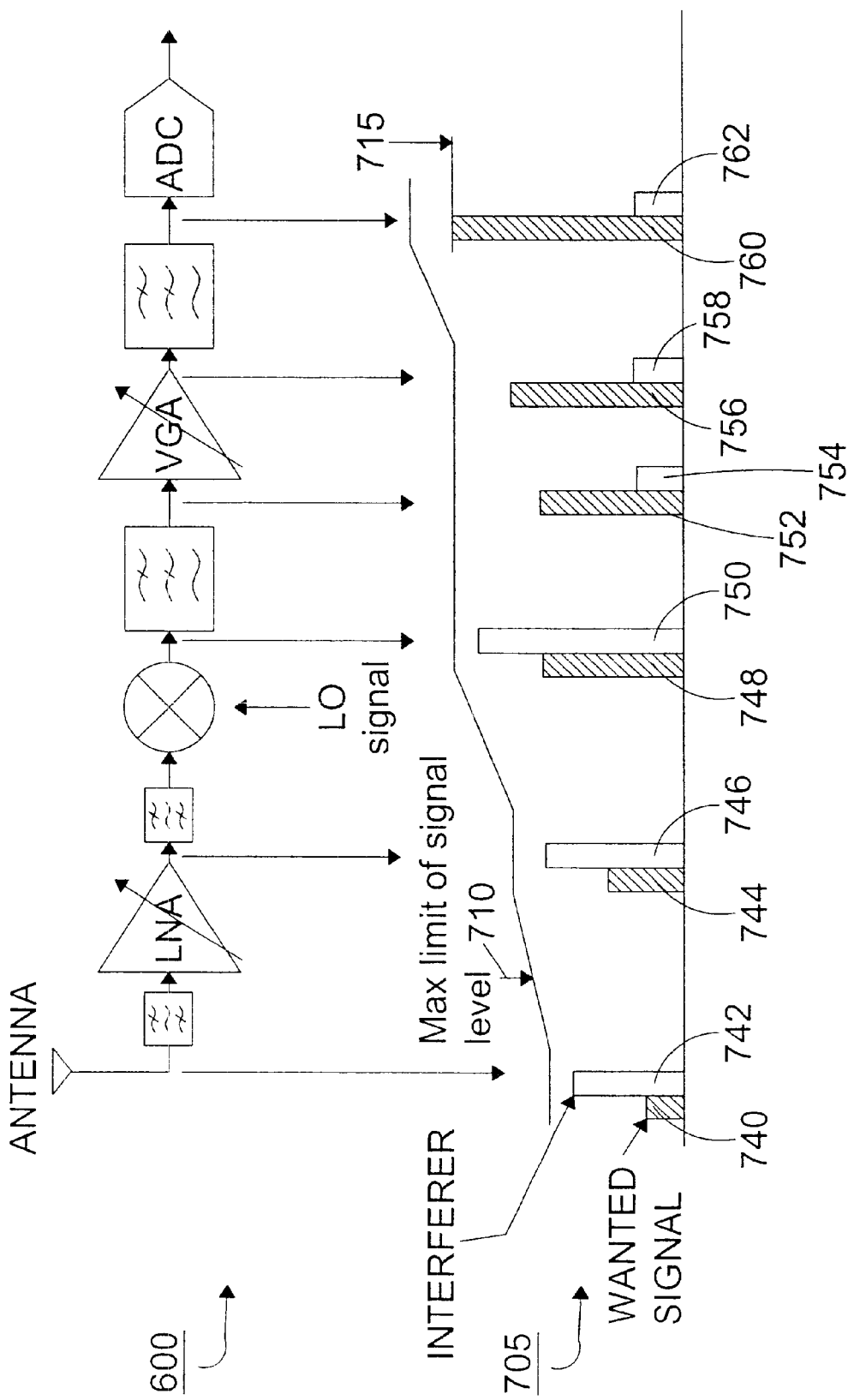
FIG. 7 is a diagram that shows signal propagation in the system of FIG. 6.
Figure 8:
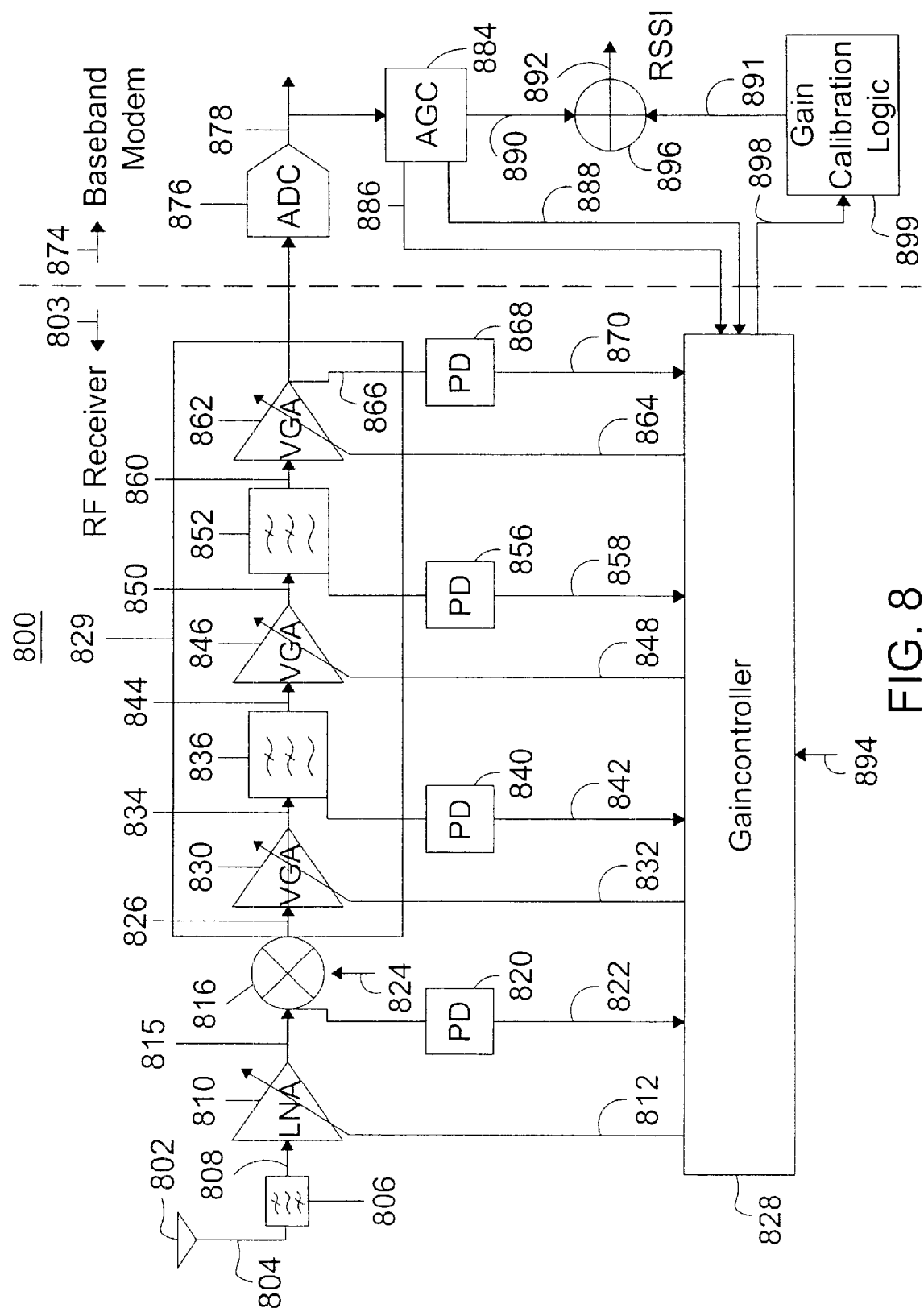
FIG. 8 is a block diagram that shows a preferred embodiment of a communication system according to the present invention.

FIG. 8 is a diagram that shows a preferred embodiment of a communication system according to the present invention. As shown in FIG. 8, a communication system 800 includes a RF receiver circuit 803 and a baseband modem 874. An antenna 802 feeds an output 804 to a duplex filter 806. An output 808 of the duplex filter 806 is received by a LNA 810 whose output 815 is received by a mixer 816 and a power detection block (PD) 820. The mixer 816 also receives a LO signal 824. An output 826 of the mixer 816 is received by the variable gain amplifier (VGA) 830. An output 834 of the VGA 830 is received by a power detection block (PD) 840 and a BB filter 836. An output 844 of the BB filter 836 is fed into a second VGA 846, and an output 850 of the second VGA 846 is received by a PD 856 and a second BB filter 852. A third VGA 862 receives an output 860 of the second BB filter 852. An output 866 of the third VGA 862 is received by a PD 868 and is transferred out of the RF receiver 803 into the baseband modem 874, and input into an ADC 876. An output 878 of the ADC 876 is fed into an automatic gain control AGC block 884 and is an output signal of the system 800.

Control signals such as a GAIN_CTRL signal 886 and a GAIN_SET signal 888 of the AGC 884 are received by a gain controller 828. The gain controller 828 is preferably also adjusted by an additional control signal being a GAIN_FRZ_TIME 894 (described below), and receives power detection outputs 822, 842, 858, and 870 from the PDs 820, 840, 856, and 868, respectively. The gain controller 828 outputs control signals 812, 832, 848, and 864 to the LNA 810, the VGA 830, the VGA 846 and the VGA 862, respectively. A status signal such as a GAIN_RPT signal 898 from the gain controller 828 can be received by a gain calibration logic 899 in the baseband modem 874. Logic block 896 receives outputs 890, 891 from the AGC 884 and the gain calibration logic 899, respectively, and outputs a RSSI signal 892.

Operations of the RF receiver 803 will now be described. The antenna 802 receives RF signals. The received RF signal is composed of various RF bands. Selected RF signals are then filtered at the duplex filter 806. That is, out-of-band RF signals (e.g., irrelevant RF bands) are removed by the duplex filter 806. The in-band RF signals passing through the LNA 810 are directly demodulated into baseband signals by multiplication at the mixer 816 because the frequency of the LO signal 824 is preferably equal to the carrier frequency. The down-converted signal 826 is amplified by three stages in the baseband circuit 829. Preferably, the baseband circuit 829 includes the VGA 830, the BB filter 836, the VGA 846, the BB filter 852, and the VGA 862. However, the present invention is not intended to be so limited. For example, additional gain stages or other circuits for the gain stages can be incorporated into the baseband circuit 829. The down-converted signal 826 is amplified by the VGA 830 before passing through the corresponding BB filter 836 to prevent signal-to-noise-ratio (SNR) degradation by noise injection from the BB filter 836. The down-converted first amplified filtered signals 844 are amplified by the VGA 846 before passing through the corresponding BB filter 852 to reduce SNR degradation by the low pass filter. The down-converted twice amplified filtered signals 860 are amplified by VGA 862 and become respective signals required for A/D conversion at the ADC 876.

As shown in FIG. 8, the system 800 includes a first stage (e.g., LNA 810), a second stage (e.g., VGA 830), a third stage (e.g., VGA 846), and a fourth stage (e.g., VGA 862). The second through fourth stages are included in the baseband circuit 829. Thus, the RF receiver 803 under control of the baseband modem 874 preferably controls a total gain (e.g., distributed) for a desired input signal to an analog front-end of a direct conversion RF system.

The gain controller 828 accepts a control signal 886 (GAIN_CTRL in FIG. 8) from the baseband modem 874 indicating a required adjustment in gain. All gain stages have corresponding power detection blocks (e.g., PD in FIG. 8) that preferably detect the output power level of a particular corresponding stage. The monitored power level is used to place signal levels within the associated dynamic range of the corresponding gain stage element. When the GAIN_CTRL signal is activated from modem 874, the gain controller 828 adjusts the gain of one or more stages while considering the PD outputs. However, the gain control of the baseband modem 874 can be implemented in the receiver 803. The monitoring function of the gain controller 828 ensures that the power level of each gain stage output lies within its dynamic range. As a result, all signal chains through the multiple gain stages meet the stringent requirements of noise and linearity.

Figure 9:
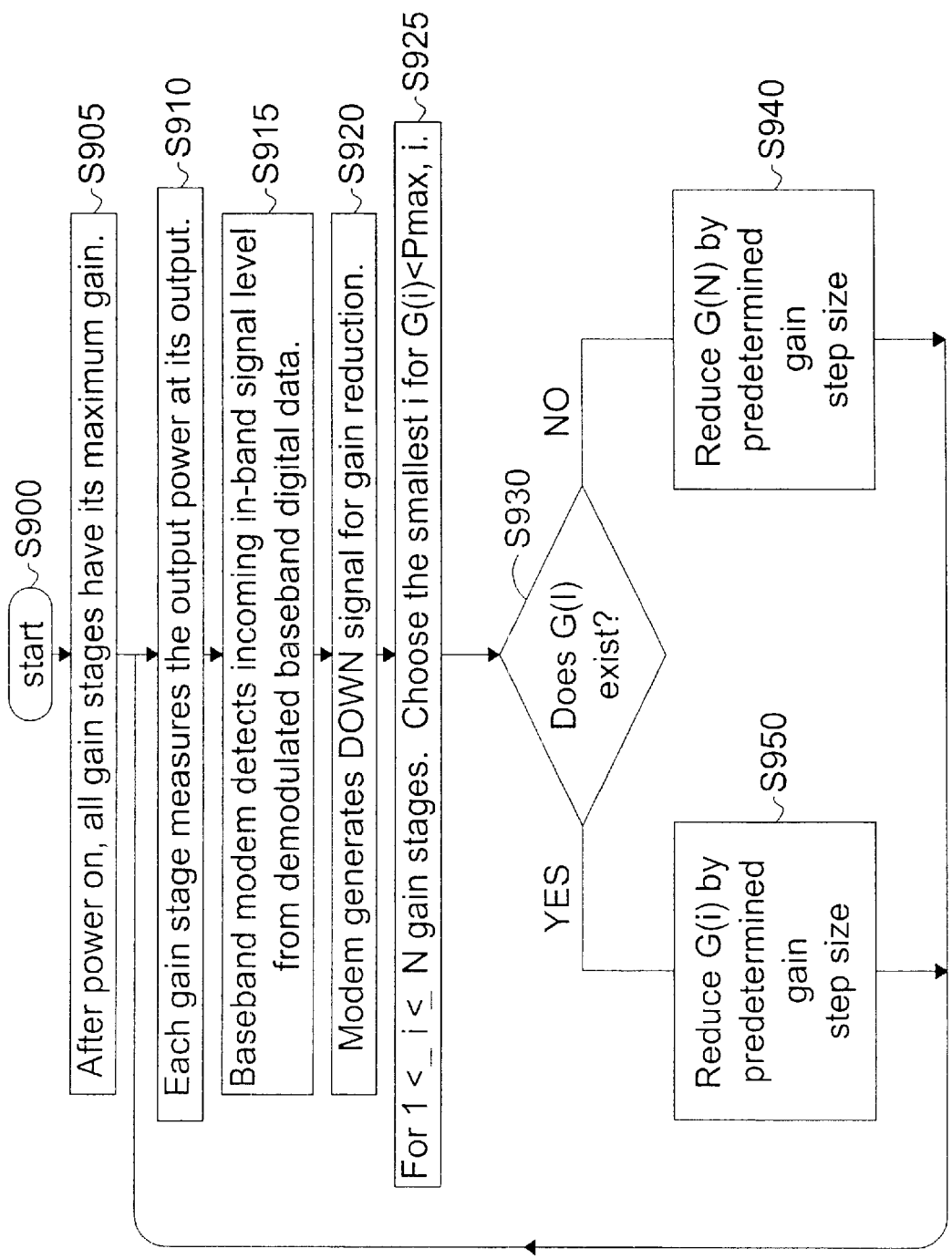
FIG. 9 is a flow diagram that shows a preferred embodiment of a power control method according to the present invention.

FIG. 9 is a flow diagram that shows a preferred embodiment of a power control method according to the present invention. As shown in FIG. 9, a demodulated signal power from the baseband modem is assumed to be too large. After beginning in step S900, control continues to step S905 where after power-on, the total gain is set to a maximum or minimum value depending on the particular implementation of the baseband modem. For example, the total gain can be set to its maximum level by setting each gain stage to a maximum gain to detect the desired signal (e.g., in-band RF signal). From step S905, control continues to step S910 where the PD in each gain stage operates and reports the corresponding detected power level preferably to a gain controller (e.g., gain controller 828). From step S910, control continues to step S915 where the baseband modem detects the incoming in-band signal level from the demodulated baseband digital data. From step S915, control continues to step S920 where the baseband modem makes a decision to reduce gain, gain control information is sent to the gain controller preferably via the GAIN_CTRL signal set to DOWN or the like. From step S920, control continues to step S925 where a total gain for the receiver is controlled by the gain controller that determines which stages are to be gain-controlled to achieve improved or optimum performance. An exemplary decision process is illustrated in step S925 of FIG. 9.

As shown in step S925 in FIG. 9, one of the multiple gain stages is adjusted (e.g., the stage closest to the antenna) to be below a prescribed maximum for that stage (e.g., Pmax, i). From step S925, control continues to step S930 where the determination is made if a gain stage of the receiver can be reduced. If the determination in step S930 is affirmative, control jumps to step S950 where a gain of the selected stage is reduced by a selected gain step size. If the determination in step S930 is negative, control continues to step S940 where a total gain is reduced by reducing gain of the final gain stage (G(N)) by the selected gain step size. From steps S940 and S950, a determination of the gain of the incoming in-band signal is determined, for example as shown in FIG. 9 where control jumps back to step S910. Alternatively, the process could end after steps S940 and S950.

Figure 10A:
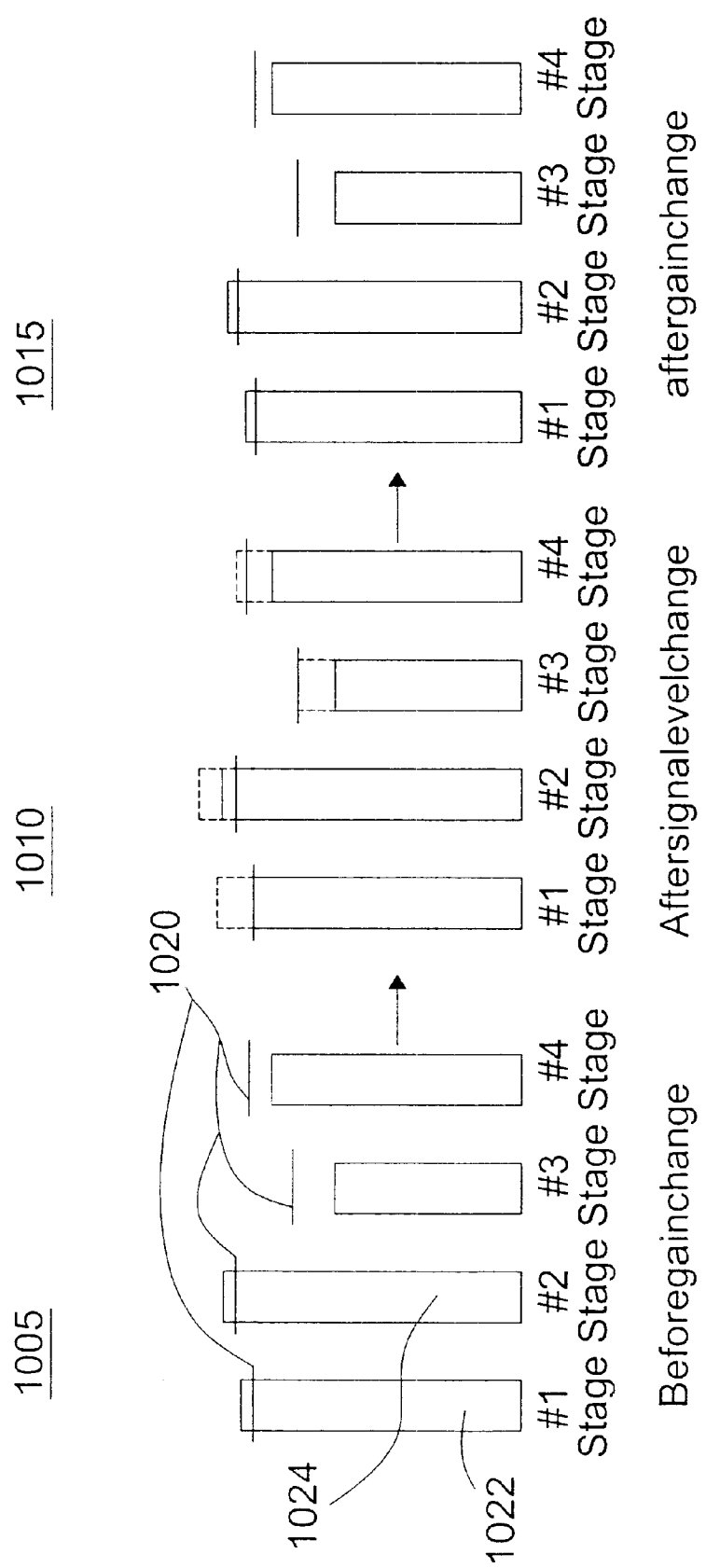
FIGS. 10A–10B are diagrams that show a gain reduction process for multiple gain stages according to the method of FIG. 9.
Figure 10B:
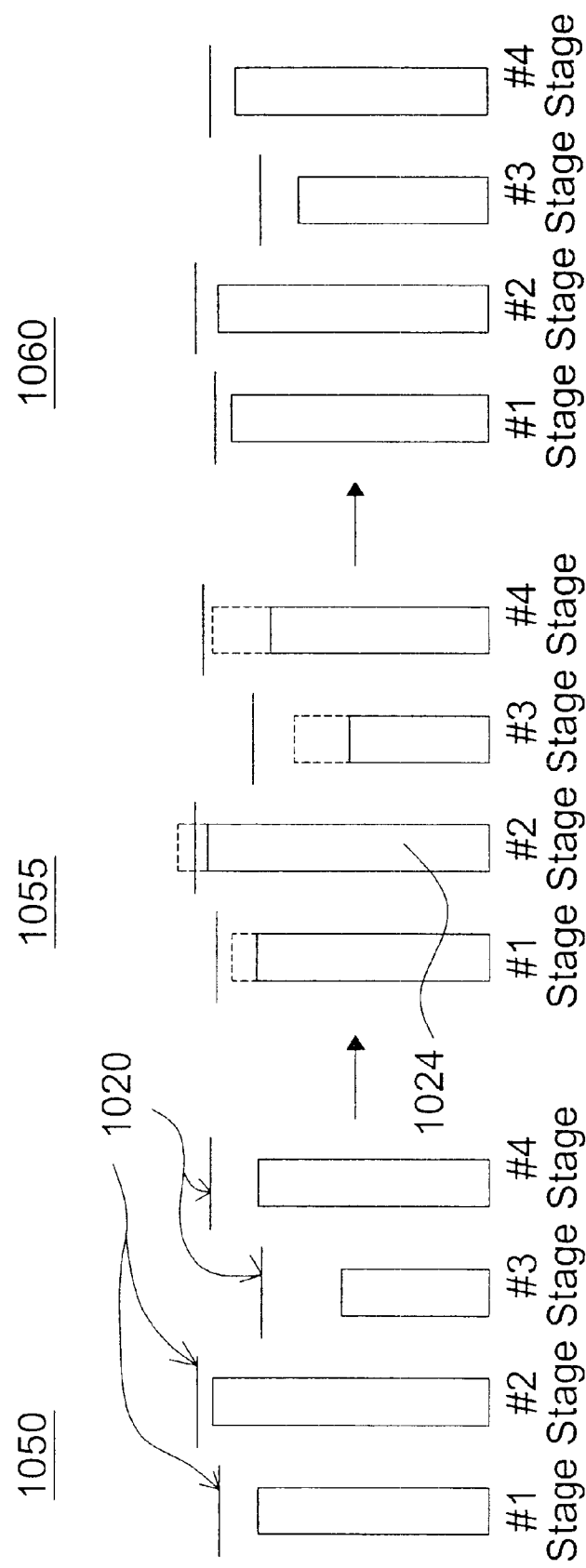

An example gain adjustment process will now be described with respect to FIGS. 9–10B. As shown in FIG. 10A, the initially assigned gain 1005 before a signal level adjustment has the first stage 1022 (e.g., LNA 810 of FIG. 8) and the second stage 1024 (e.g., VGA 830 of FIG. 8) exceed a corresponding upper limit of signal level 1020 (e.g., its maximum signal allowed level). When the demodulated in-band signal level goes high, a DOWN signal (e.g., GAIN_CTRL) is generated from the modem (e.g., modem 874).

Since the gain controller (e.g., gain controller 828) already knows the gain assignment and signal level of each stage, the gain controller can directly determine an improved or optimal gain distribution. Criteria used in such a determination depend on the actual configuration of the radio receiver, but is generally a trade-off between noise and-linearity. Referring to FIG. 10A, as the input signal level 1010 goes up, the signal level in the inner gain-stage is raised by approximately the same amount. Since the noise and the linearity greatly depend on front-end circuits (e.g., the LNA or VGA following the mixer), it is desirable to have the signal level be as close as possible to the maximum bound (i.e., Pmax in FIG. 9) of the front-end circuits. Accordingly, when a gain reduction is required, it is reasonable to reduce the gain of the stage that is closest to the antenna as shown in FIG. 9. However, the present invention is not intended to be so limited. Again, or as shown in the initially assigned gain 1005 of FIG. 10A, the signal level in the first and second gain stages exceeds the maximum bound, and thus, the gain of first stage (LNA) is reduced for gain control to achieve the improved or optimal gain distribution. This reduction is shown in the assigned gain 1015 in FIG. 10A. A signal level change impacts the adjustment process.

In the example shown in FIG. 10A, some gain stages are outside the corresponding dynamic range. In practice, such a situation is likely to happen, because pre-planning and circuit design is based on a worst case scenario. Accordingly, in stringent transmission conditions, the signal level of the receiver is well-restricted within the bound, if the circuit is properly designed. Nonetheless, the decision power level or peak power level should be designed to have a moderate margin for safe operation.

Another example gain adjustment process will now be described with respect to FIG. 10B. In the example shown in FIG. 10B, only the second stage has excessive gain instead of the first stage in a gain assignment 1050. The signal level of the second stage 1024 is above an upper limit of the signal level 1020. Thus, the gain controller decreases the gain of the second stage instead of the first stage to achieve improved or optimal gain distribution 1060. Again, a signal level change 1055 in an assigned gain can impact the gain adjustment process.

Figure 11A:
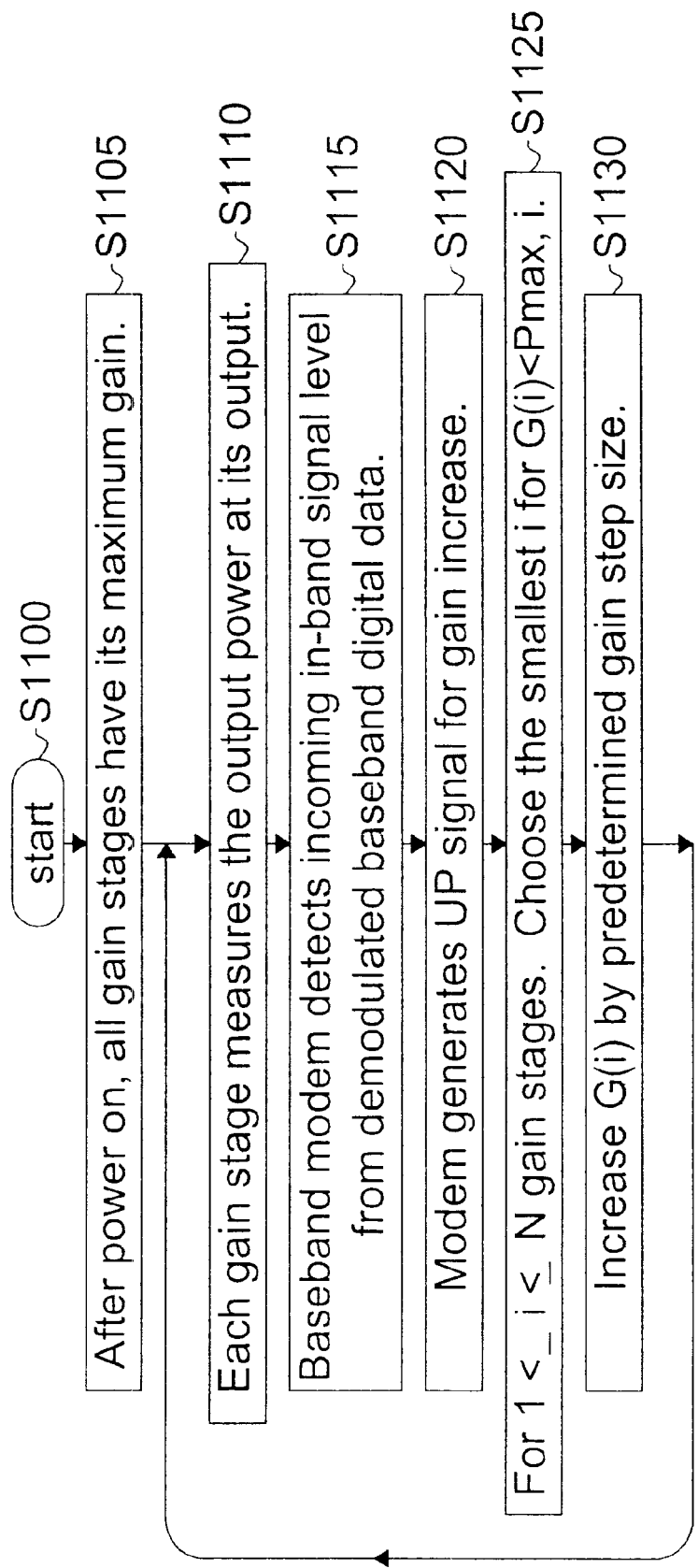
FIG. 11A is a flow diagram that shows another preferred embodiment of a power control method for RF receiver according to the present invention.

FIG. 11A is a flow diagram that shows another preferred embodiment of a power control method according to the present invention. As shown in FIG. 11A, a demodulated signal power from the baseband modem is assumed to be too small. A control method for increasing gain begins in step S1100. From step S1100, control continues to step S1105 where after power-on, the total gain is set to a maximum or minimum value depending on the particular implementation of the baseband modem. For example, the total gain can be set to its maximum level to detect the desired signal. From step S1105, control continues to step S1110 where the PD in each gain stage operates and reports its power level preferably to a gain controller (e.g., gain controller 828). From step S1110, control continues to step S1115 where the baseband modem detects the incoming in-band signal level from the demodulated baseband digital data. From step S1115, control continues to step SI 120 where the baseband modem makes a decision to increase gain, gain control information is sent to the gain controller preferably via the GAIN_CTRL signal set to UP or the like. From step Si 120, control continues to step S1125 where a total gain for the receiver is controlled by the gain controller that determines which stage is to be gain-controlled to achieve improved or optimum performance. An exemplary decision process is illustrated in step S1 125 of FIG. 11A.

As shown in step S1 125 in FIG. 11A, one of the multiple (i.e., N) gain stages (e.g., 1≦i≦N) is increased (e.g., the stage closest to the antenna) but adjusted to be below a prescribed maximum for that stage (e.g., Pmax). From step S1125, control continues to step S1130 where the determined increase for the stage gain of the receiver is performed, preferably by a prescribed gain step size. From step S1 130, a determination of the gain of the incoming in-band signal is performed, for example, as shown in FIG. 11A, control jumps back to step S1110. The design criterion for increasing gain includes adjusting the gain (e.g., stage and/or total gain) without degrading the requirements of total linearity within the system. By choosing the gain stage closest to the antenna by ensuring the gain does not exceed the upper signal bound 1120 (FIG. 11B), increased or optimal noise and linearity performance can be achieved concurrently.

Figure 11B:
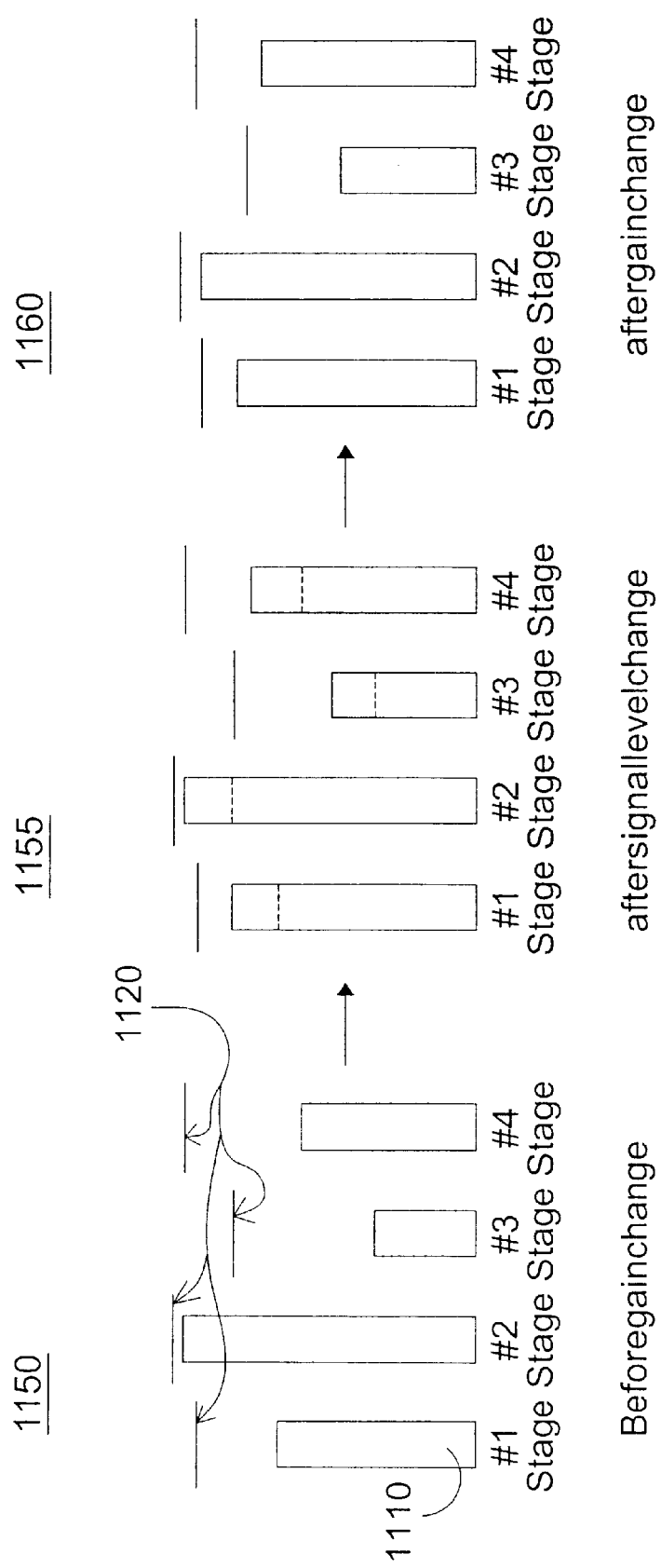
FIG. 11B is a diagram that shows a gain increase process for multiple gain stages according to the method of FIG. 11A.

FIG. 11B shows an example of the gain increase process. Since the first gain stage depicted in the gain assignment 1150 does not have enough gain, the additional gain is assigned to the first gain stage 1110 to result in a gain assignment 1160. A signal level change 1155 can impact the gain adjustment process and illustrates a status after the signal level change.

In another preferred embodiment of a gain control system and method according to the present invention, a step size of gain can be adjusted by adjusting a gain step size and an adjustable delay. For example, the GAIN_SET 888 and GAIN_FRZ_TIME 894 signals shown in FIG. 8, could be used and thus more flexible and faster gain tracking can be realized. The GAIN_SET signal is preferably used in a VGA with digital gain control elements. In a preferred embodiment, if gain setting registers are used in the corresponding VGAs, the arbitrary gain can be set to the desired register by a serial interface or other possible connection between the receiver and the baseband modem. Beneficially, a robustness of a gain setting process is increased because the gain setting is immediate and very accurate.

The GAIN_SET signal 888 can serve an additional role in gain calibration. Even though the gain characteristic is fairly linear at a system design time, the resulting gain curve is likely to be non-linear because of process variations. The GAIN SET signal 888 and the GAIN_RPT signals 898 are used to correct such errors by comparing a design value or an idealized value of assigned gain and the actual result as reported by a specific system 800. When the GAIN_RPT signal is activated, preferably the gain controller sends the gain setting value generated from the GAIN SET signal to a baseband modem or the like. The baseband mode detects the gain error by comparing the information and the demodulated signal.

Figure 12:
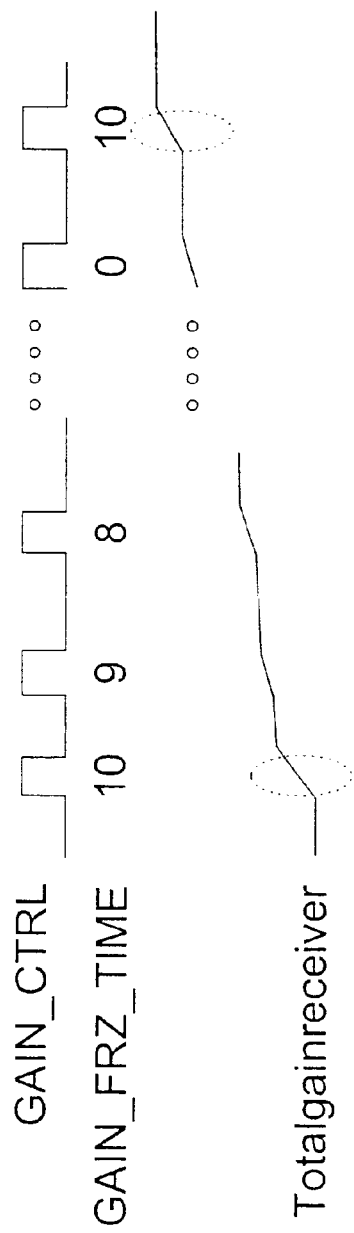
FIG. 12 is a diagram that illustrates another preferred embodiment of a gain control method with delay intervals according to the present invention.

The GAIN_FRZ_TIME signal 894 can serve an additional control function. The GAIN_FRZ_TIME signal 894 can preferably be used to control the updating interval of gain when the gain step size is not identical. As determined by Applicants, in practical design of receiver systems, particularly in digital gain control, the number of bits for gain control is a burden and increasing the number of bits makes the receiver complex. Accordingly, another preferred embodiment of a communication system and method uses a two step gain control for coarse and fine tuning. As a practical example, the state-of-the-receiver controls the gain of the LNA in a discrete manner, even in a switch mode. A potential problem in a receiver system is the degradation of the SNR when the demodulated signal undergoes abrupt changes in gain, which in turn, results in signal fluctuations. The degradation of the SNR is aggravated when the large signal fluctuations are frequent. The GAIN_FRZ_TIME signal 894 is preferably used to reduce the probability of SNR degradations. The GAIN_FRZ_TIME 894 signal preferably applies to the gain stages with large gain step sizes and sets the minimum time interval between two consecutive gain changes for that stage. Accordingly, as shown in a preferred embodiment of a gain control process illustrated in FIG. 12, the GAIN_FRZ_TIME indicates the number of gain changes between consecutive coarse tunings of gain. For example, as shown in FIG. 12, coarse tuning is blocked until the counter value reaches 10 (this only applies to FIG. 12, and the actual number depends on the overall architecture), even if the signal level of the gain stage with coarse tuning in its gain meets the requirements discussed above with respect to FIGS. 9 and 11A.

Figure 13:
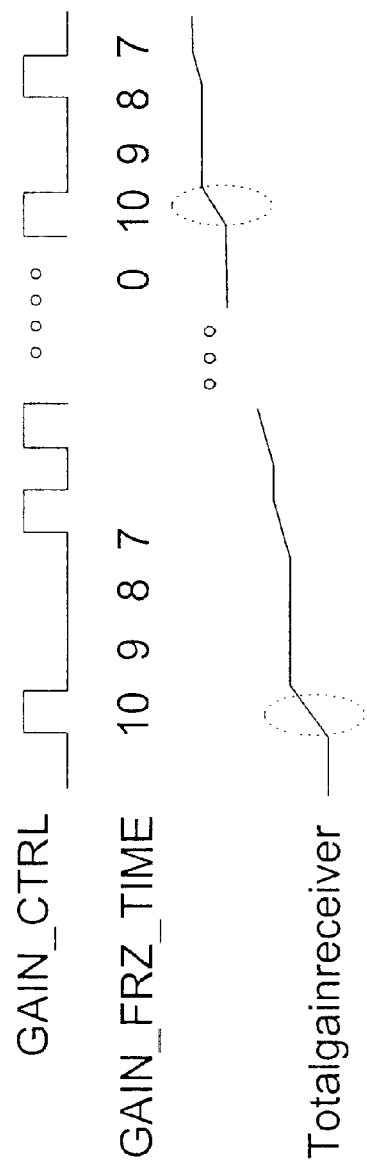
FIG. 13 is a diagram that illustrates another preferred embodiment of a gain control process with delay times according to the present invention.

FIG. 13 shows another preferred embodiment of an implementation of a two step gain control process (e.g., coarse and fine tuning). As shown in FIG. 13, the GAIN_FRZ_TIME signal 894 as the gain freeze signal is defined as an absolute time interval enabling coarse gain tuning. Thus, coarse gain tuning is activated only once during the GAIN_FRZ_TIME interval.

Figure 14:
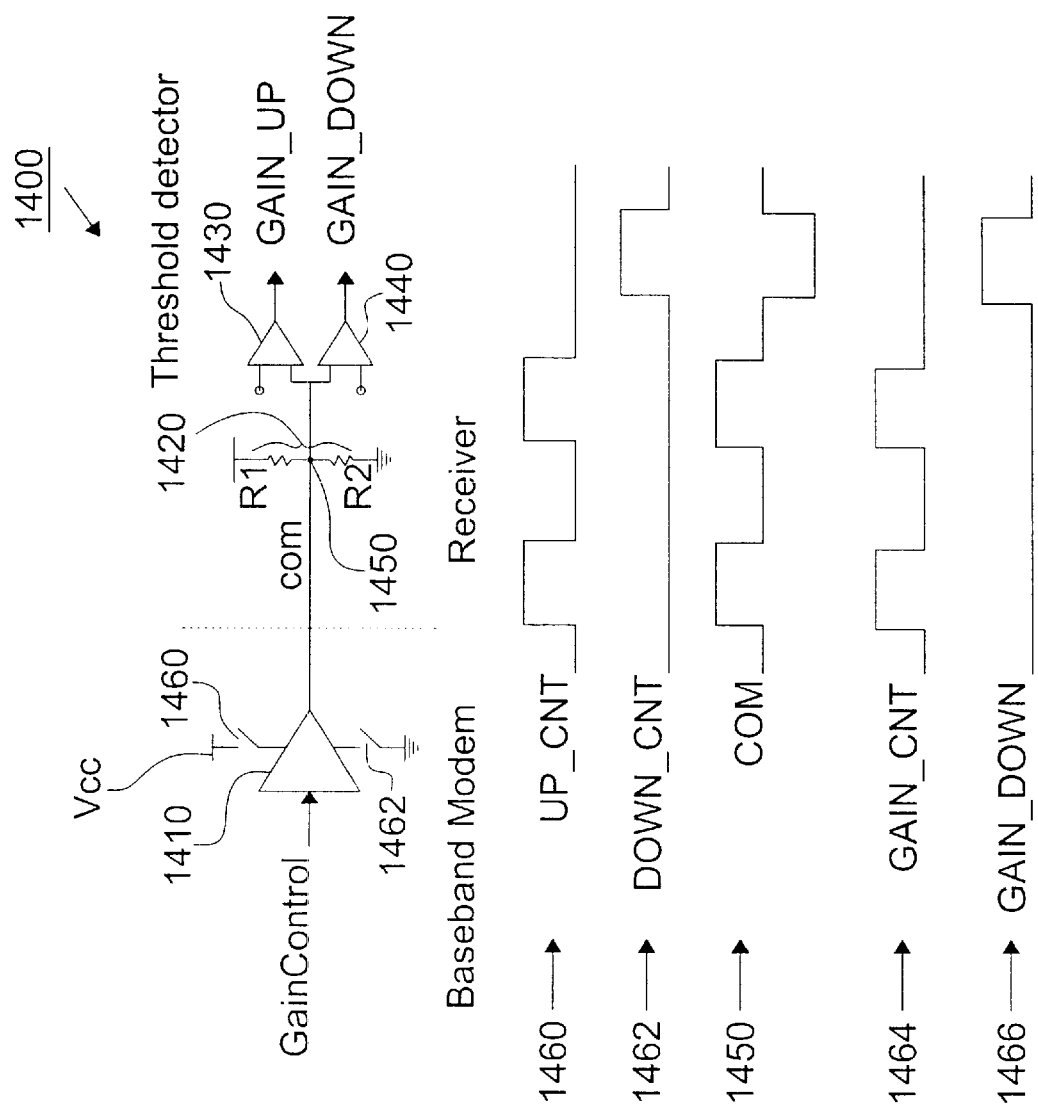
FIG. 14 is a diagram of a preferred embodiment of a gain control signal generator.

FIG. 14 is a diagram that shows a preferred embodiment of a gain control signal generator. As shown in FIG. 14, a generator 1400 generates a gain control signal (e.g., the GAIN_CTRL signal) preferably in a digital gain loop. In contrast to a related art PDM approach, a baseband modem generates an UP or DOWN signal depending on the gain control direction. Preferably, when there is no message of gain control, no signal is generated from the modem. As shown in FIG. 14, for example, a tri-state buffer 1410 is used in the generator 1400 to achieve such a gain control. On the receiver side, a resistor divider 1420 and two level detectors 1430 and 1440 are used to form a reference generator that detects a sign of the gain change. Operations of the circuit 1400 will now be described. When there is no gain change, a COM node 1450 is held at the voltage defined by relative values of the two resistors R1, R2 coupled in series between ground and a power source voltage Vcc. When the gain is to be increased, the modem generates an UP current by generating a positive pulse of an UP_CNT signal 1460. The input of the threshold detector 1410 or the COM node undergoes a transition to high. The transition to high of the COM node is preferably used to indicate gain increase. When the gain is to be decreased, the GAIN_DOWN signal undergoes a transition from low to high. The GAIN_UP and GAIN_DOWN signals 1464, 1466 are preferably used as the actual gain control signal in the gain controller. Accordingly, the GAIN_UP and GAIN_DOWN signals generate corresponding UP_CNT and DOWN_CNT signals 1460, 1462. Thus, the gain increase and gain decrease signals can be transmitted by using a signal wire with the help of a threshold detector and resistive divider such as the gain control signal generator 1400.

As described above, alternative preferred embodiments of a receiver can be implemented using the system 800 with additional control signals including the GAIN_SET signal 888, the GAIN_RPT signal 898 and the GAIN_FRZ_TIME signal 894. Thus, these signals can be considered optional to the preferred embodiment of the system 800 described above.

As described above, the system 800 generates a single output signal from the ADC 876. However, the system 800 can further include a second mixer, second baseband circuit and a second ADC to generate a second digital signal for a second channel. Then, the digital output signals of the ADC 876 are preferably one of an I channel and a Q channel. The two sets of signals I and Q are preferably used to increase an ability of the system 800 to identify or maintain received information regardless of noise or interference. Sending two types of signals having different phases reduces the probability of information loss or change. Further, the gain controller 828 or an additional gain controller can be used to control the multiple stage gain according to preferred embodiments of the present invention.

The present invention can be implemented for gain control in wireless communication receivers, such as GSM, PCS, and IMT2000. Since the invention deals with the gain control in communication channels having interference problems, the present invention can also be implemented to achieve gain control in wired communication receivers such as cable modems.

As described above, preferred embodiments of a gain control system and method for a communication system have various advantages. Since the gain control is only activated by a baseband modem, stability is not an issue. The preferred embodiments of the receiver circuit and methods for operating same increase gain control efficiency when there is a need for distributed gain allocation, for example, in cases of strong interferers and weak signal conditions. Distributed gain allocation is strongly required to obtain superior noise and linearity performance in a wireless or wired highly integrated receiver or the like. In integrated receiver design, preferred embodiments include cascading the amplifier and filtering stages. Preferred embodiments according to the present invention measure the signal level of inner stages and changes in the gain with respect to the prescribed design criteria. Further, preferred embodiments of receiver and control are applicable to systems where coarse and fine tuning of gain is incorporated and reduce problems caused by the use of an independent AGC loop regardless of the type of analog and digital gain control used. Thus, preferred embodiments implement automatic gain control in a highly integrated radio receiver, in which channel selection filtering and gain assignment is distributed to several gain and filtering stages. Preferred embodiments provide a robust gain control loop with optimal dynamic range and no stability problems and generation of a gain control signal is present for digital gain control.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of operating a communication system, comprising:

receiving signals including selected signals having a carrier frequency;

first amplifying the received selected signals;

detecting a first output level of the first amplified selected signals;

demodulating-mixing the first amplified selected signals to output demodulated selected signals having a frequency reduced from the carrier frequency;

second amplifying the demodulated selected signals in a plurality of gain stages until the selected signals reach a prescribed criteria;

detecting a second output level of the second amplified selected signals;

digitizing the second amplified selected signals;

determining an amplification amount of the digitized selected signals and generating a gain control signal responsive thereto; and controlling a gain distributed among the first and second amplifying according to the gain control signal and the first and second output levels.

2. The method of claim 1, wherein the second amplifying comprises sequentially amplifying the selected signals in the plurality of gain stages, wherein the controlling the gain comprises implementing a gain control of one of the first amplifying and a selected one of the sequentially amplifying the selected signals that is out of an assigned corresponding range of amplification.

3. The method of claim 2, further comprising:

filtering the received selected signals;

low pass filtering each output of the sequentially amplifying steps except for a final sequentially amplifying step;

A/D converting the sequentially amplified selected signals into digital signals; and discrete-time signal processing the digital signals.

4. The method of claim 1, wherein the second amplifying comprises sequentially amplifying the selected signals not less than twice, and wherein the first and second output levels are power levels.

5. The method of claim 1, wherein the communication system is one of a cellular phone, a personal digital assistant, an internet appliance, a remote control device and a laptop computer.

6. The method of claim 1, wherein the controlling the gain comprises implementing a gain control of one of the first amplifying and the second amplifying by a single prescribed amount.

7. The method of claim 6, wherein the prescribed amount is one of an increase and a decrease implemented as early as possible prior to digitizing.

8. A direct conversion communication system, comprising:
- a first gain stage that amplifies selected signals among received signals having a carrier frequency;
- a demodulator-mixer that mixes the received amplified carrier frequency selected signals and outputs baseband selected signals;
- a baseband amplification circuit that includes a plurality of additional gain stages that receive the baseband selected signals and selectively amplify in-channel signals to a prescribed amplitude; and
- a gain controller coupled to receive outputs of the gain stages and to control each of the gain stages, wherein the gain controller controls distributed gain among the gain stages to achieved a prescribed total gain.

9. The communications system of claim 8, further comprising:
- an antenna that receives the signals having the carrier frequency;
- a RF filter coupled to the antenna that filters the received selected signals;
- an A/D converting unit that converts the selected signals from a last gain stage of the plurality of additional gain stages into digital signals; and
- a discrete-time signal processing unit that receives the digital signals.

10. The communications system of claim 8, further comprising:
- an A/D converting unit that converts the selected in-channel signals from the last gain stage of the plurality of additional gain stages into digital signals; and
- a modem gain control circuit that monitors gain of the digital signals received from the A/D converting unit and outputs a control signal to the gain controller.

11. The communication system of claim 10, wherein the gain controller receives the control signal to change the total gain, and wherein the gain controller distributes the change in the total gain over the gain stages.

12. The communications system of claim 11, wherein the gain controller implements the change in the total gain by adjusting one of a gain stage closest to an antenna and an initial gain stage of the plurality of additional gain stages by a prescribed gain step.

13. The communication system of claim 11, wherein the gain controller implements the change in the total gain by adjusting at least one gain stage of the gain stages into a linearity range.

14. The communication system of claim 10, wherein a preset distributed gain level is compared to an actual gain of the digital signals to determine a process error in the gain stages.

15. The communication system of claim 8, wherein the gain controller implements a two tiered gain control, wherein the first tier is implemented in a selected gain stage only once in a prescribed time interval, and wherein the second tier is implemented independent of the prescribed time interval.

16. The communications system of claim 8, wherein an adjacent channel in the baseband selected signals has a greater power level than the in-channel signals upon input to the plurality of additional gain stages.

17. The communications system of claim 8, wherein the total gain is controlled by a baseband modem and the gain controller to increase a SNR of the system.

18. The communications system of claim 8, wherein the gain controller operates said each of the gain stages in a corresponding linearity range.

* * * * *

UNITED STATES PATENT AND TRADEMARK OFFICE
CERTIFICATE OF CORRECTION

PATENT NO.    : 6,498,927 B2
DATED         : December 24, 2002
INVENTOR(S)   : Kang et al.

It is certified that error appears in the above-identified patent and that said Letters Patent is hereby corrected as shown below:

Title page,
Item [75], Inventors, should read as -- Suwon Kang, Seoul (KR); Jeong-Woo Lee, Seoul (KR); Joonbae Park, Seoul (KR) and Kyeongho Lee, Seoul (KR) --

Signed and Sealed this

Third Day of August, 2004

JON W. DUDAS
*Acting Director of the United States Patent and Trademark Office*